(12) United States Patent
Jeon et al.

(10) Patent No.: US 9,105,452 B2
(45) Date of Patent: Aug. 11, 2015

(54) ETCHING APPARATUS AND ETCHING METHOD

(71) Applicant: SAMSUNG ELECTRONICS CO., LTD., Suwon-si, Gyeonggi-do (KR)

(72) Inventors: Kyung-Yub Jeon, Yongin-si (KR);
Jeong-Yun Lee, Yongin-si (KR);
Kyung-Sun Kim, Suwon-si (KR);
Tae-Gon Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/199,160

(22) Filed: Mar. 6, 2014

(65) Prior Publication Data

US 2014/0251956 A1 Sep. 11, 2014

(30) Foreign Application Priority Data

Mar. 6, 2013 (KR) .................. 10-2013-0023761

(51) Int. Cl.
*H01L 21/00* (2006.01)
*H01J 37/32* (2006.01)

(52) U.S. Cl.
CPC ..... *H01J 37/32568* (2013.01); *H01J 37/32577* (2013.01); *H01J 37/32706* (2013.01); *H01J 37/32715* (2013.01)

(58) Field of Classification Search
CPC .................... H01J 37/32715; H01J 37/32697; H01J 37/32706; H01J 37/32577; H01J 37/32027; H01J 37/32045
USPC ....... 118/723 E; 156/345.43, 345.44, 345.45, 156/345.46, 345.47, 345.28; 361/234; 279/128

See application file for complete search history.

(56) References Cited

U.S. PATENT DOCUMENTS

| 5,928,528 | A  | * | 7/1999  | Kubota et al. ................ 216/67 |
| 6,316,369 | B1 |   | 11/2001 | Yanagisawa et al. |
| 6,734,964 | B1 |   | 5/2004  | Duan et al. |
| 7,532,936 | B2 |   | 5/2009  | Erickson et al. |
| 2006/0034032 | A1 | * | 2/2006  | White et al. ................ 361/234 |
| 2008/0289576 | A1 | * | 11/2008 | Lee et al. ................ 118/723 I |
| 2009/0194508 | A1 | * | 8/2009  | Ui et al. ................ 216/67 |
| 2011/0051306 | A1 |   | 3/2011  | Wang et al. |
| 2011/0303844 | A1 | * | 12/2011 | Kanno et al. ................ 250/307 |
| 2012/0074864 | A1 |   | 3/2012  | Ding |
| 2013/0133578 | A1 | * | 5/2013  | Hwang ................ 118/723 E |

FOREIGN PATENT DOCUMENTS

KR 10-1999-0029246 A 4/1999

* cited by examiner

*Primary Examiner* — Sylvia R MacArthur
*Assistant Examiner* — Anna Crowell
(74) *Attorney, Agent, or Firm* — Lee & Morse, P.C.

(57) ABSTRACT

An apparatus for an etching process includes a chamber, a plasma generator disposed in the chamber, a stacked structure disposed in the chamber to support a substrate thereon and including an electrode plate and an insulation coating layer on the electrode plate, electrode rods inserted into through holes of the stacked structure to penetrate through the stacked structure, directly contacting the substrate and spaced apart from sidewalls of the through holes of the stacked structure, at least one DC pulse generator generating a DC pulse to the electrode plate and the electrode rods, first connection lines connecting the DC pulse generator to the electrode rods, and at least one second connection line connecting the DC pulse generator to a lower portion of the electrode plate.

14 Claims, 18 Drawing Sheets

ETCHING APPARATUS AND ETCHING METHOD

CROSS-REFERENCE TO RELATED APPLICATION

Korean Patent Application No. 10-2013-0023761, filed on Mar. 6, 2013, and entitled, "Etching Apparatus and Etching Method," is incorporated by reference herein in its entirety.

BACKGROUND

1. Field

One or more embodiments herein relate to an etching a semiconductor device.

2. Description of the Related Art

Various processes using plasma have been used to manufacture a semiconductor device. For example, the plasma may be used in an etching process, a deposition process, a surface modification process, etc. In a dry etching process using plasma, an electric field may be used to accelerate reactive ions in a direction toward a substrate. The accelerated ions etch a layer on the substrate or the substrate itself.

SUMMARY

In accordance with one embodiment, an etching apparatus including a chamber; a plasma generator in the chamber; a stacked structure in the chamber to support a substrate thereon, the stacked structure including an electrode plate and an insulation coating layer on the electrode plate; electrode rods inserted into holes of the stacked structure to directly contacting the substrate, the electrode rods being spaced apart from sidewalls of the respective ones of the holes; at least one DC pulse generator to provide a DC pulse to the electrode plate and the electrode rods; first connection lines connecting the DC pulse generator to the electrode rods; and at least one second connection line connecting the DC pulse generator to a lower portion of the electrode plate.

The first connection lines may electrically connect the electrode rods to each other, and electrically connect the DC pulse generator to the electrode rods.

The apparatus may include a single DC pulse generator, the at least one second connection line branches off from one or more of the first connection lines, and the single DC pulse generator is electrically connected in parallel to the first connection lines. The apparatus may include at least two DC pulse generators, and the first and the second connection lines are respectively connected to the at least two DC pulse generators.

A voltage control circuit may be electrically connected to at least one of the first connection lines or the at least one second connection line. The voltage control circuit includes a variable resistor or a variable capacitor.

The electrode plate may include insulating patterns arranged between electrode plate patterns, and the electrode plate is divided into conductive portions and insulating portions by the electrode plate patterns and the insulating patterns. The electrode plate may have a substantially cylindrical or circular shape, and an upper surface of the electrode plate may have a grid pattern. The electrode plate may have a substantially cylindrical or circular shape, and an upper surface of the electrode plate may be divided into concentric areas.

In accordance with another embodiment, an etching method includes loading a substrate onto a stacked structure in a chamber, the stacked structure including an electrode plate and an insulating coating layer on the electrode plate; generating plasma in the chamber; supplying a first DC pulse to first portions of the substrate using electrode rods that are in direct contact with the first portions of the substrate; supplying a second DC pulse to the electrode plate to control an electric potential of a second portion of the substrate facing the electrode plate; and etching the substrate or a layer on the substrate using reactive ions which are accelerated by the first and the second DC pulses.

An absolute value of the second DC pulse may be substantially equal to as or greater than an absolute value of the first DC pulse. The electrode plate may include conductive portions and insulating portions, and voltage levels of the second DC pulse supplied to respective ones of the conductive portions of the electrode plate may be controlled independently to adjust the electric potentials of portions of the substrate facing the conductive portions.

An upper surface of the electrode plate may have a grid pattern or may include concentric areas. The first and the second DC pulses supplied to the electrode rods and the electrode plate, respectively, may be generated by a same DC pulse generator, and voltage levels of the DC pulses may be controlled by a plurality of voltage control circuits, respectively.

The first and second DC pulses may be supplied to the electrode rods and the electrode plate, respectively, the first and second DC pulses may be generated by different DC pulse generators, and voltage levels of the DC pulses may be controlled by a plurality of voltage control circuits, respectively.

In accordance with another embodiment, an apparatus includes a base to support a substrate; a plurality of electrode rods extending through holes in the base; and at least one voltage control circuit coupled to one or more of the plurality of electrode rods, wherein the electrode rods accelerate reactive ions of plasma toward the substrate in response to a first voltage signal and wherein the at least one voltage control circuit adjusts a voltage level of the first voltage signal to control an electric potential of the base. The electric potential of the base may control an etching rate of the substrate.

A first area of the base may include the one or more electric rods, and a second area of the substrate may not include electric rods and receives a second voltage signal, wherein an electric potential of the first area of the base may be controlled by the first voltage signal and an electric potential of the second area may be controlled by the second voltage signal.

The first voltage signal and the second voltage signal may independently control the electric potentials of the first and second areas of the base. A first voltage control circuit may be coupled to the one or more electric rods, and a second voltage control circuit is may be coupled to the second area of the base, wherein the first voltage control circuit may adjust the first voltage signal to a fist level and the second voltage control circuit controls may adjust the second voltage signal to a second level different from the first level.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
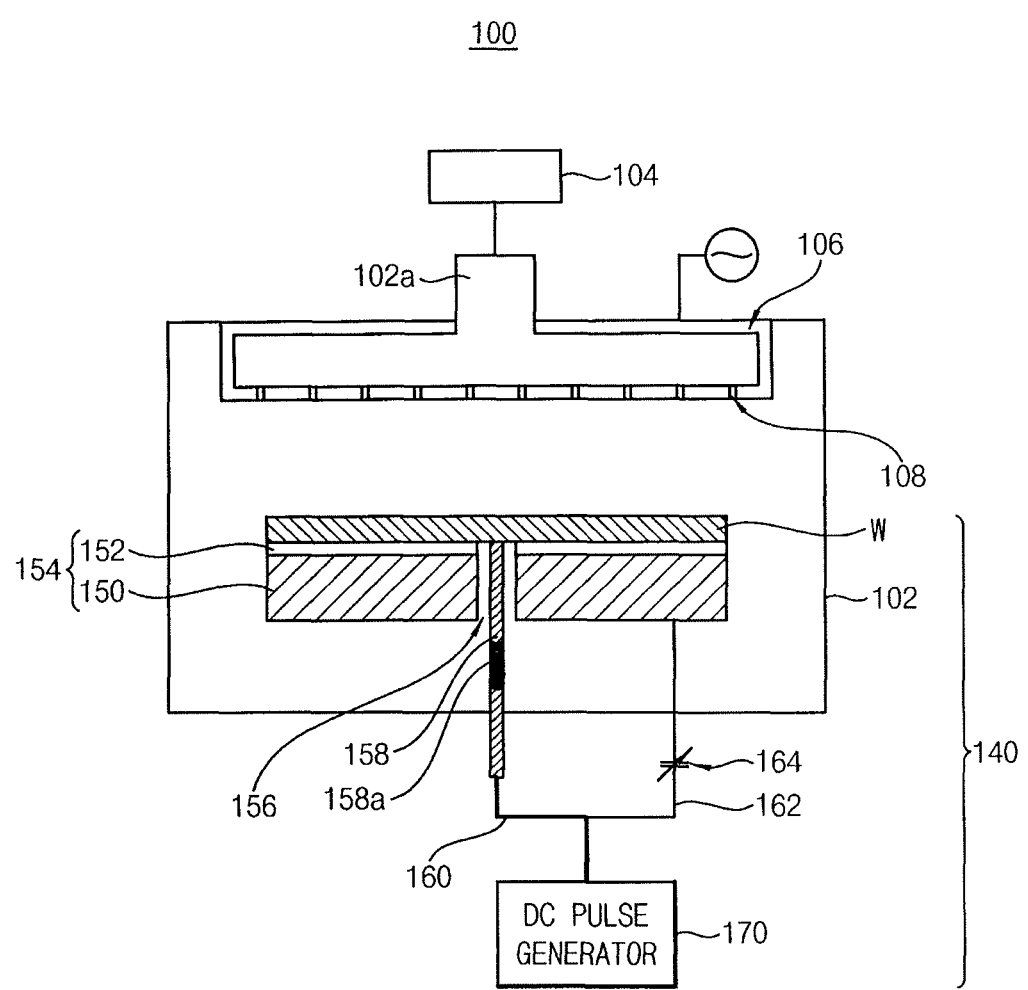
FIG. 1 illustrates an embodiment of an etching apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Plasma Etching Apparatus

Figure 2:
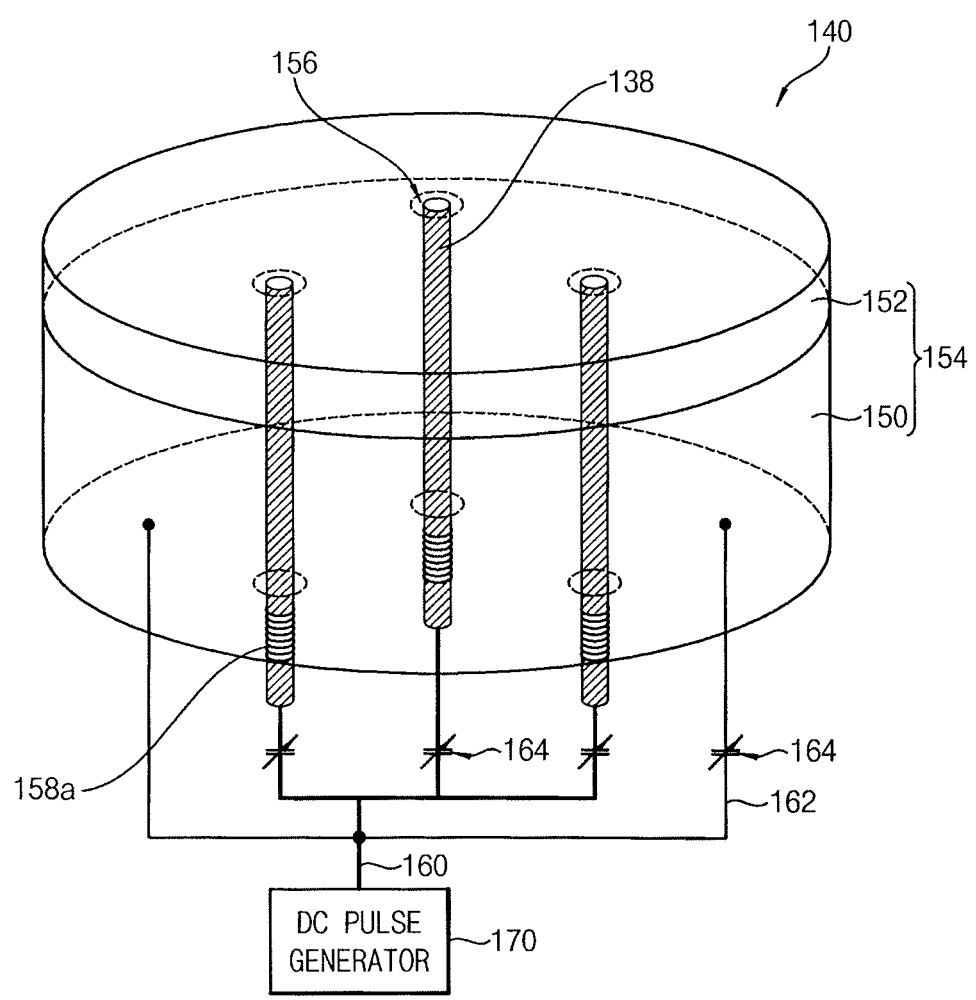
FIG. 2 illustrates an example of an ion accelerator in the etching apparatus.
Figure 3A:
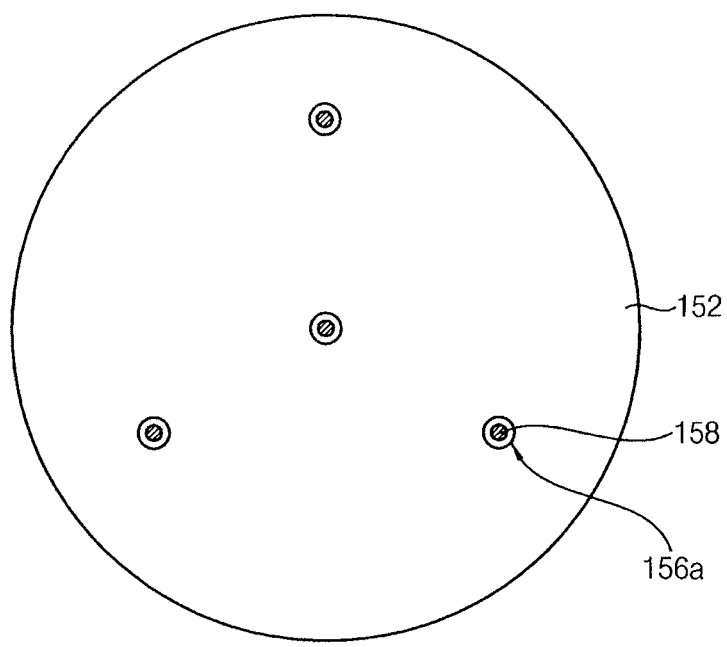
FIGS. 3A and 3B illustrate additional examples of an ion accelerator.
Figure 3B:
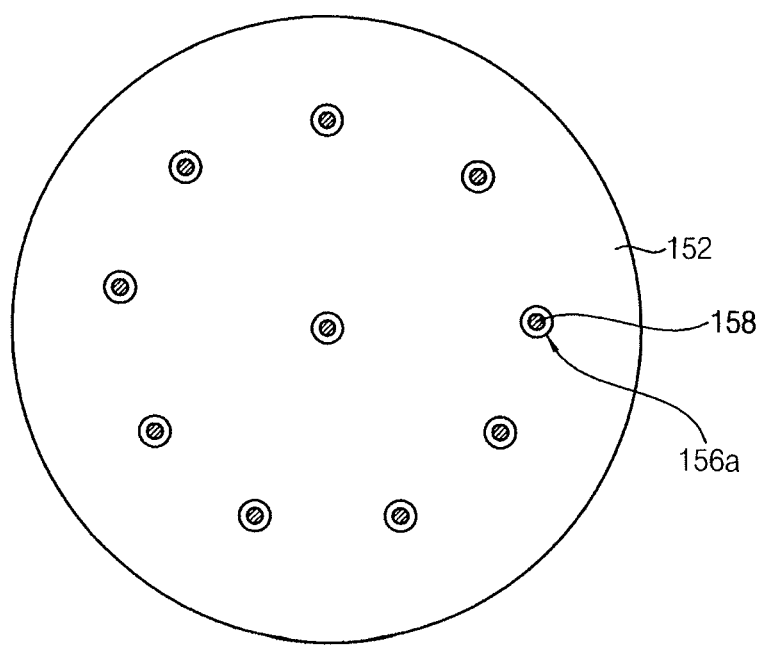

FIG. 1 illustrates an embodiment of an etching apparatus, and FIG. 2 illustrates an example of ion accelerator that may be used in the etching apparatus of FIG. 1. FIGS. 3A and 3B illustrate additional examples of an ion accelerator that may be used in the etching apparatus of FIG. 1.

Referring to FIG. 1, an etching apparatus 100 may include a chamber 102, a gas supply unit 104, a plasma generator 106, an ion accelerator 140, and a gas exhauster unit. The chamber 102 may have a gas inlet 102a and a gas outlet. The gas inlet 102a may be provided on an upper surface of the chamber 102. The gas outlet may be provided on a side surface or a lower surface of the chamber 102.

The gas supply unit 104 may be connected to the gas inlet 102a of the chamber 102. The gas supply unit 104 may provide an etching gas into the chamber 102 through the gas inlet 102a.

The plasma generator 106 may be disposed in an upper portion of the chamber 102. A radio frequency (RF) power may be supplied to the plasma generator 106 to generate plasma. The plasma generator 106 may generate capacitively coupled plasma using a capacitive-coupling method or an inductively coupled plasma using an inductive-coupling method. The plasma generator 106 may provide the plasma from the etching gas. As illustrated, nozzles 108 may be provided through an electrode for generating the plasma.

The ion accelerator 140 may disposed in a lower portion of the chamber 102. The ion accelerator 140 may serve as or include a chuck to support a bottom surface of a substrate W. Additionally, the ion accelerator 140 may accelerate reactive ions of the plasma generated in the chamber 102 in a direction toward the substrate W. A DC voltage pulse may be supplied to the substrate W to accelerate the reactive ions.

Referring to FIGS. 2, 3A and 3B, the ion accelerator may include an electrode plate 150, an insulation coating layer 152, a plurality of electrode rods 158, first and second connection lines 160 and 162, a voltage control circuit 164, and a DC pulse generator 170. The electrode plate 150 and/or the insulating coating layer 152 may be considered to be a base.

The electrode plate 150 may be formed as one body and may include a conductive material. The insulation coating layer 152 may be formed on an entire upper surface of the electrode plate 150. The insulation coating layer 152 may include, for example, a ceramic material. A stacked structure 154 including the electrode plate 150 and the insulation coating layer 152 may serve as a chuck to support and load the substrate W. Therefore, the substrate W may not contact the electrode plate 150 as a result of the insulation coating layer 152.

When the substrate W is on the stacked structure 154, a capacitor may be formed. Specifically, the electrode plate 150 and the substrate W may form the plates of the capacitor, and the insulation coating layer 152 may serve as a dielectric layer between the plates. Therefore, when the DC voltage pulse is supplied to the electrode plate 150, an electric potential of the substrate W facing the electrode plate 150 may be increased by the capacitive-coupling method. A permittivity and a thickness of the insulation coating layer 152 may be adjusted to control the electric potential of the substrate W. For example, when the permittivity is increased and the thickness is reduced, the electric potential of the substrate W may be increased.

The substrate W on the stacked structure 154 may have various shapes, e.g., a disc shape. The stacked structure 154 may have a corresponding shape, e.g., a cylindrical shape. Also, an upper surface of the stacked structure 154 may have an area substantially the same as or greater than that of the substrate W. Thus, the whole edge portion of the substrate W may contact the stacked structure 154 in one example embodiment.

The stacked structure 154 may include through holes 156 through which the electrode rods 158 are inserted. The through holes 156 may penetrate through the stacked structure 154 from the upper surface to a lower surface thereof. Thus, portions of the substrate W facing the through holes 156 may not directly contact the insulation coating layer 152 of the stacked structure 154.

FIGS. 3A and 3B illustrate different arrangements of the through holes 156 of the stacked structure 154 and the electrode rods 158. As illustrated in FIGS. 3A and 3B, the through holes 156 may be arranged at portions in which the electrode rods 158 are inserted. Four through holes 156 with corresponding electric rods 158 are shown in FIG. 3a, and ten through holes 156 with a corresponding electric rods 158 are shown in FIG. 3B.

Moreover, in one embodiment, the electrode rods 158 may be arranged in a uniform pattern across the upper surface of the stacked structure 154. For example, in FIG. 3A, three of the four through holes 156 and electric rods 158 may be arranged in a circle with a same angular spacing of 120°. The fourth through hole 156 and electric rod 158 may be located at a center position. In FIG. 3B, nine of the ten through holes 156 and electric rods may be arranged in a circle with a same angular spacing of 40°. The tenth through hole 156 and angular rod 158 may be located at a center position.

Other embodiments may include a different number of through holes and rods and/or with a uniform or non-uniform angular spacing. For example, the through holes and rods may be spaced at non-equal angular intervals. Also, the through holes and rods may be arranged in a pattern different from a circle such as a matrix, rectangle, or other predetermined pattern. In one embodiment, the predetermined pattern may correspond to a general shape of the stacked structure 154, e.g., if the stacked structure is rectangular in shape, the through holes and rods may be arranged in a rectangular or matrix pattern.

Each electrode rod 158 may include a conductive pin to supply the DC voltage pulse to a bottom surface of the substrate W, which is supported on the upper surface of the stacked structure 154. The electrode rods 158 may have a shape which allows them to be inserted into the through holes 156. In one embodiment, the electrode rod 158 may be spaced from inner sidewalls of the through hole 156. Thus, the electrode rods 158 may not contact the stacked structure 154 and may not be electrically connected to the electrode plate 150. In other embodiments, an insulation layer or material may be disposed between each electric rod 158 and the inner sidewall of a corresponding through hole 156. The cross-sectional shape of the electric rods 158 may correspond to the shape of the through holes 156, or may have a different shape from the through holes 156.

The electrode rods 158 may contact directly the bottom surface of the substrate W on the upper surface of the stacked structure 154. The upper surface of the electrode rod 158 may have a height substantially the same as or greater than the upper surface of the stacked structure 154. Elastic material 158a may be connected at lower portions of all or a portion of the electrode rods 158. The elastic material 158a, for example, may be a spring as shown in FIG. 2. The electrode rods 158 may move up and down (e.g., reciprocally within through holes 156) by action of the spring.

The DC pulse generator 170 may generate a DC voltage pulse to be supplied to the electrode rods 158 and the electrode plate 150. For example, the DC pulse generator 170 may generate a DC voltage pulse, which, for example, may be a pulsed voltage pulse of several to hundreds of kV levels with a predetermined cycle.

The first connection line 160 may electrically connect the DC pulse generator 170 with the electrode rods 158. The electrode rods 158 may be electrically connected to each other, and the electrode rods 158 and the DC pulse generator may be electrically connected to each other by the first connection line 160.

The second connection line 162 may electrically connect the DC pulse generator 170 with the electrode plate 150. For example, the second connection line 162 may be electrically connected to at least one lower portion of the electrode plate 150. The electrode plate 150 may be one body including a conductive material. As a result, the DC voltage pulse may be supplied to the entire electrode plate 150 even if the second connection line 162 is electrically connected to only a portion of the electrode plate 150. In FIG. 2, the second connection line 162 is illustratively shown to be electrically connected to two or more lower portions of the electrode plate 150.

The second connection line 162 may be branched off from the first connection line 160 to be connected to the electrode plate 150. That is, the electrode plate 150 may be electrically connected in parallel to a circuit connecting the DC pulse generator 170 and the electrode rods 158, so that the DC voltage pulse is supplied to the electrode plate 150. The first connection line 160 and the second connection line 162 may be coupled together a node.

The voltage control member 164 may be provided in either or both of the first and second connection lines 160 and 162. The voltage control member 164 may increase or decrease a voltage of the DC voltage pulse generated by the DC pulse generator 170. The voltage control members 164 may include a variable capacitor or a variable resistor.

One or more voltage control members 164 may be arranged differently in different embodiments. For example, as illustrated in FIG. 1, one or more voltage control member 164 may be provided only in the second connection line 162, and the variable capacitor may be used as the voltage control member 164. In this case, a level of the DC voltage pulse which is supplied to the electrode plate 150 may be adjusted. In another example, as illustrated in FIG. 2, multiple voltage control members 164 may be provided in the first and second connection lines 160 and 162, and implemented as variable capacitors. In this case, levels of the DC voltage pulses supplied to the electrode plate 150 and the electrode rods 158 may be adjusted, respectively. The voltage control members may adjust levels of the DC voltage pulses by a same amount or by different amounts, depending on the application.

Although a variable capacitor is illustrated as the voltage control member 164 in the figures, the voltage control members may alternatively be variable resistors coupled to one or more of the first and second connection lines 160 and 162.

The etching apparatus 100 may supply the DC voltage pulse generated by the DC pulse generator 170 to the electrode rods 158 and the electrode plate 150, to uniformly increase an electric potential across the entire area of the substrate W. Reactive ions in the chamber 102 may be accelerated by the increased electric potential to etch a layer on the substrate W or the substrate W itself uniformly or according to a predetermined pattern.

Figure 4A:
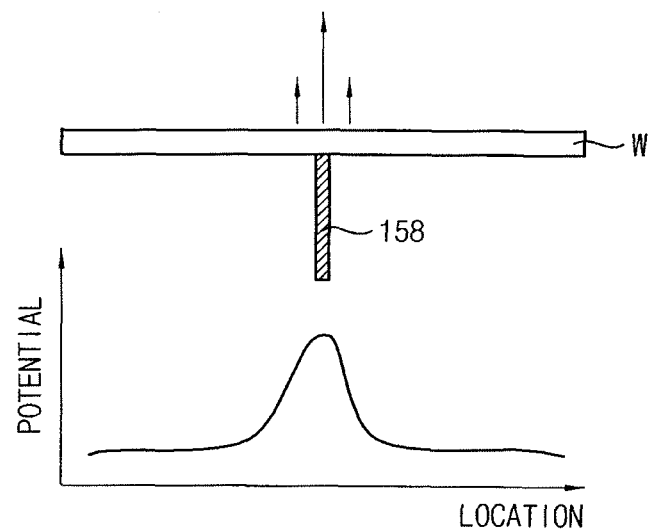
FIGS. 4A to 4C are graphs illustrating electric potentials of the ion accelerator.
Figure 4B:
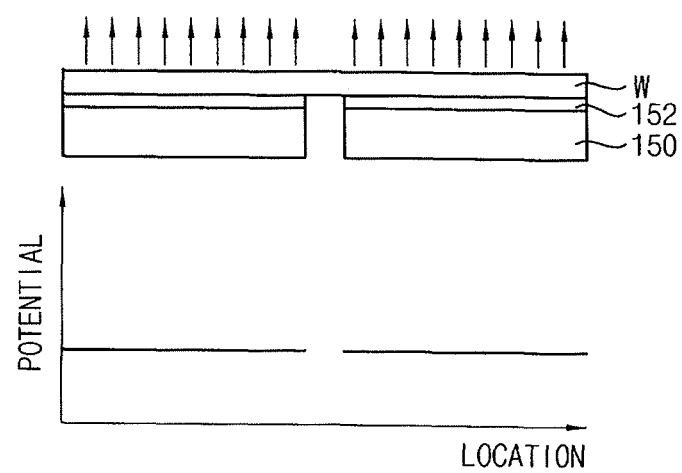
Figure 4C:
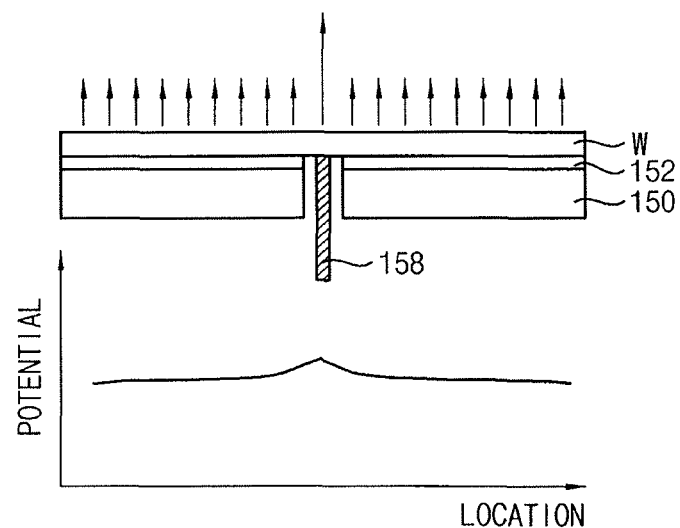

FIGS. 4A to 4C illustrate the electric potential of each portion of the substrate W, when the ion accelerator 140 of the etching apparatus 100 of FIG. 1 is used.

Figure 5:
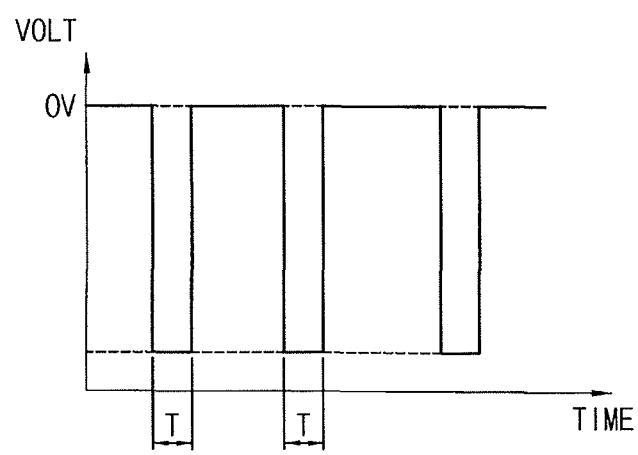
FIG. 5 illustrates a DC pulse generated by a DC pulse generator.

FIG. 4A illustrates the electric potential of the substrate W by the electrode rod 158. FIG. 4B illustrates the electric potential of the substrate W by the electrode plate 150. FIG. 4C illustrates the electric potential of the substrate W on the ion accelerator 140. FIG. 5 illustrates one example of the DC voltage pulse generated by the DC pulse generator 170.

The DC pulse generator 170 may generate the DC voltage pulse, and the DC voltage pulse may be supplied to the electrode rods 158 and the electrode plate 150 via the first and second connection lines 160 and 162.

Referring to FIGS. 4A and 5, the DC voltage pulse generated by the DC pulse generator 170 may be supplied directly to first portions of the bottom surface of the substrate W via the first connection line 160 and the electrode rods 158. Hereinafter, the DC voltage pulse supplied to the first portions may be referred to as a first DC pulse.

When the first DC pulse is supplied during a cycle, the electric potential of the first portion of the substrate W directly connected to each electrode rod 158 may increase by a large amount. Additionally, the electric potential of a portion of the substrate W adjacent to each first portion may increase by a large amount. The electric potential of a portion of the substrate W farther away from each electrode rod 158 may increase by a smaller amount by the first DC pulse supplied to each electrode rod 158. However, because an effect of the first DC pulse which is supplied to each electrode rod 158 at the portion away from each electrode rod 158 may be relatively small, the increased electric potential thereof may be relatively small compared with the first portion.

Referring to FIGS. 4B and 5, the DC voltage pulse generated by the DC pulse generator 170 may be supplied to the electrode plate 150 via the second connection line 162 branched off from the first connection line 160. Hereinafter, the DC voltage pulse supplied to the electrode plate 150 may be referred to as a second DC pulse.

By placing insulation coating layer 152 on the electrode plate 150, the second DC pulse may not be directly supplied to the substrate W. However, when the second DC pulse is supplied during a cycle, the electric potential of a second portion of the substrate W facing the electrode plate 150 may increase by a capacitive-coupling effect of the electrode plate 150.

Portions of the substrate W on the through holes 156 in which the electrode rods 158 are provided may not face the electrode plate 150. The electric potentials of the portions of the substrate W on the through holes 156 may not increase or may be absent when the second DC pulse is supplied to the electrode plate 150.

The electric potential of the substrate W on the ion accelerator 140 may be a result of adding the electric potential by the first DC pulse via the electrode rods 158 and the electric potential by the second DC pulse supplied to the electrode plate 150.

Referring to FIGS. 4C and 5, the electric potential of the first portion of the substrate W may increase by the first DC pulse supplied to the electrode rods 158. The electric potential of the second portion of the substrate W may increase by the second DC pulse supplied to the electrode plate 150 and the first DC pulse which is supplied to the electrode rods 158

The voltage control members 164 may be used to adjust voltages of the first and second DC pulses, such that the electric potentials of the first and second portions may be controlled independently. For example, in one embodiment, the voltage control members 164 may control the voltages so that an absolute value of the voltage of the second DC pulse is greater than that of the first DC pulse. Thus, the electric potentials of the first and second portions may be substantially the same as each other. In another embodiment, the voltage control members may control the voltages so that the first DC pulse is greater than the second DC pulse.

The etching apparatus 100 may be used such that the electric potentials of the first and second portions may be controlled independently. A force may be controlled, so that the reactive ions may be accelerated to each portion of the substrate W. As a result, an etching rate of a layer on the substrate W or the substrate W itself may be controlled.

Additionally, the electric potential of the first portion of the substrate W facing the electrode rods 158 and the second portion of the substrate W facing the electrode plate 150 may be substantially the same as each other. Thus, the entire upper surface of the substrate W may be etched uniformly, and the etching rate of the layer on the substrate W or the substrate W itself may increase.

Plasma Etching Method

Figure 6:
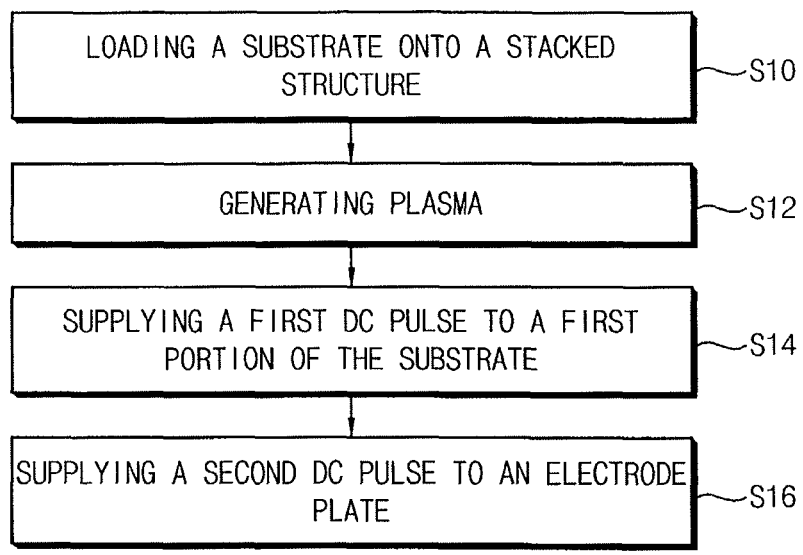
FIG. 6 illustrates an embodiment of an etching process.

FIG. 6 illustrates an embodiment of an etching method which, for example, may be performed by the etching apparatus described in FIG. 1. In other embodiments, the etching method may be performed by a different etching apparatus.

Referring to FIG. 6, a substrate W may be loaded on a stacked structure 154 in a chamber 102. The stacked structure 154 may include an electrode plate 150 and an insulation coating layer 152 (S10).

An etching gas may be introduced into the chamber 102, and plasma may be generated from the etching gas (S12).

Electrode rods 158 may be directly electrically connected to first portions of a bottom surface of the substrate W. A first DC pulse may be supplied to the first portions of the substrate W via the electrode rods 158 (S14). When the first DC pulse is supplied, an electric potential of the first portions may increase. Hereinafter, the electric potential of the first portion may be referred to as a first electric potential.

A second DC pulse may be supplied to the electrode plate 150 (S16). One DC pulse generator 170 may generate the first and second DC pulses together. A voltage of the second DC pulse may be controlled by a voltage control member 164.

When the first and second pulses are supplied, an electric potential of a second portion of the substrate W may increase by the first and second DC pulses. The electric potential thereof may be referred to as a second electric potential. The voltages of the first and second DC pulses may be substantially the same as or different from each other.

The second electric potential may be controlled by adjusting the voltage of the second DC pulse. For example, the second electric potential may be controlled so that the first and second electric potentials may be substantially the same as each other.

When the second DC pulse is supplied, the electric potential of the second portion of the substrate W may increase by a capacitive-coupling effect of the electrode plate 150. When substantially the same voltages of the first and second DC pulses are supplied to the first and second portions, the electric potential of the second portion may be smaller than that of the first portion. Accordingly, an absolute value of the voltage of the second DC pulse may be substantially the same as or greater than that of the first DC pulse such that the first and second electric potentials may be substantially the same as each other.

When the first and second DC pulses are supplied during a cycle, reactive ions may be accelerated in directions toward the first and second portions to etch a layer on the substrate W or the substrate W itself.

During the etching process, the reactive ions may be accelerated by performing charging and discharging at the first and second portions of the substrate W repeatedly. To achieve this, the DC voltage pulse may be supplied to the substrate W and the electrode plate 150. When the DC voltage pulse is supplied, the reactive ions may be accelerated. The cycle during which the first and second DC pulses are supplied may be adjusted properly.

According to the above-mentioned etching method, the electric potentials of the first portion of the substrate W facing the electrode rods 158 and the second portion of the substrate W facing the electrode plate 150 may be substantially the same as each other. Thus, the entire upper surface of the substrate W may be etched uniformly, and the etching rate of the layer on the substrate W or the substrate W itself may be increased.

Plasma Etching Apparatus

Figure 7:
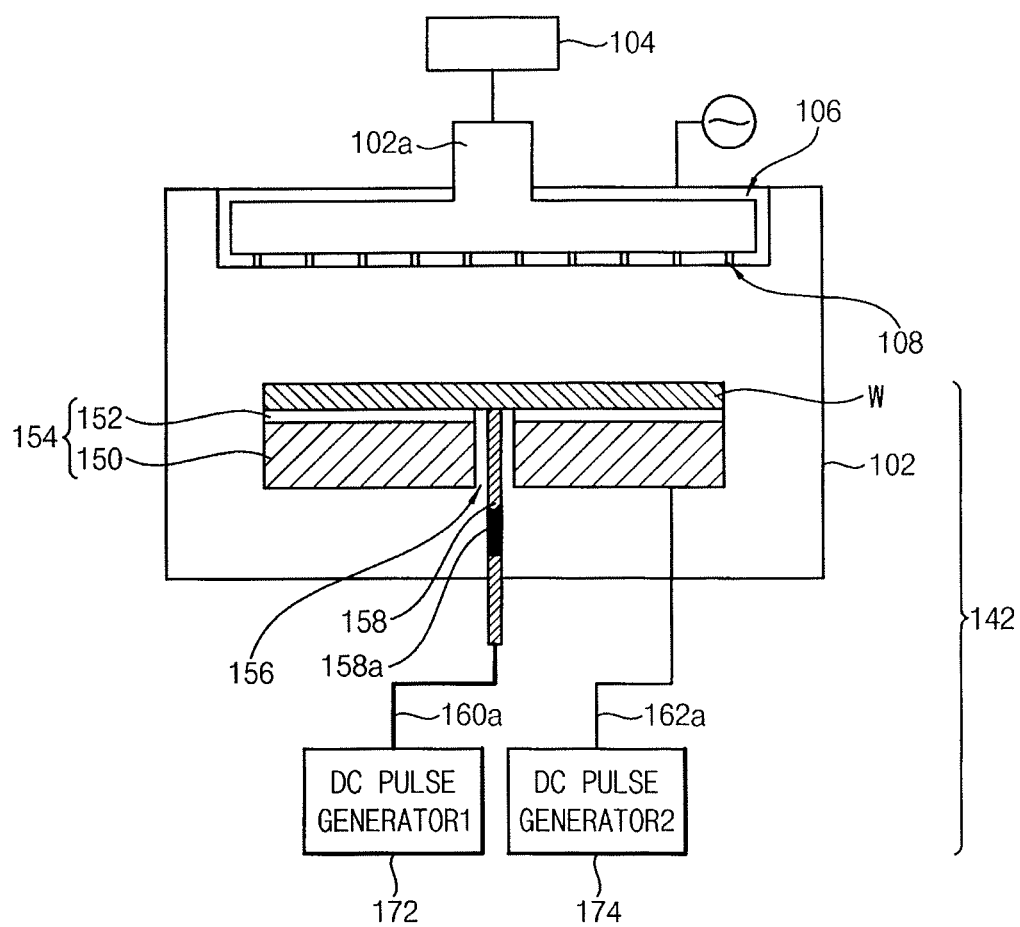
FIG. 7 illustrates another embodiment of an etching apparatus.
Figure 8:
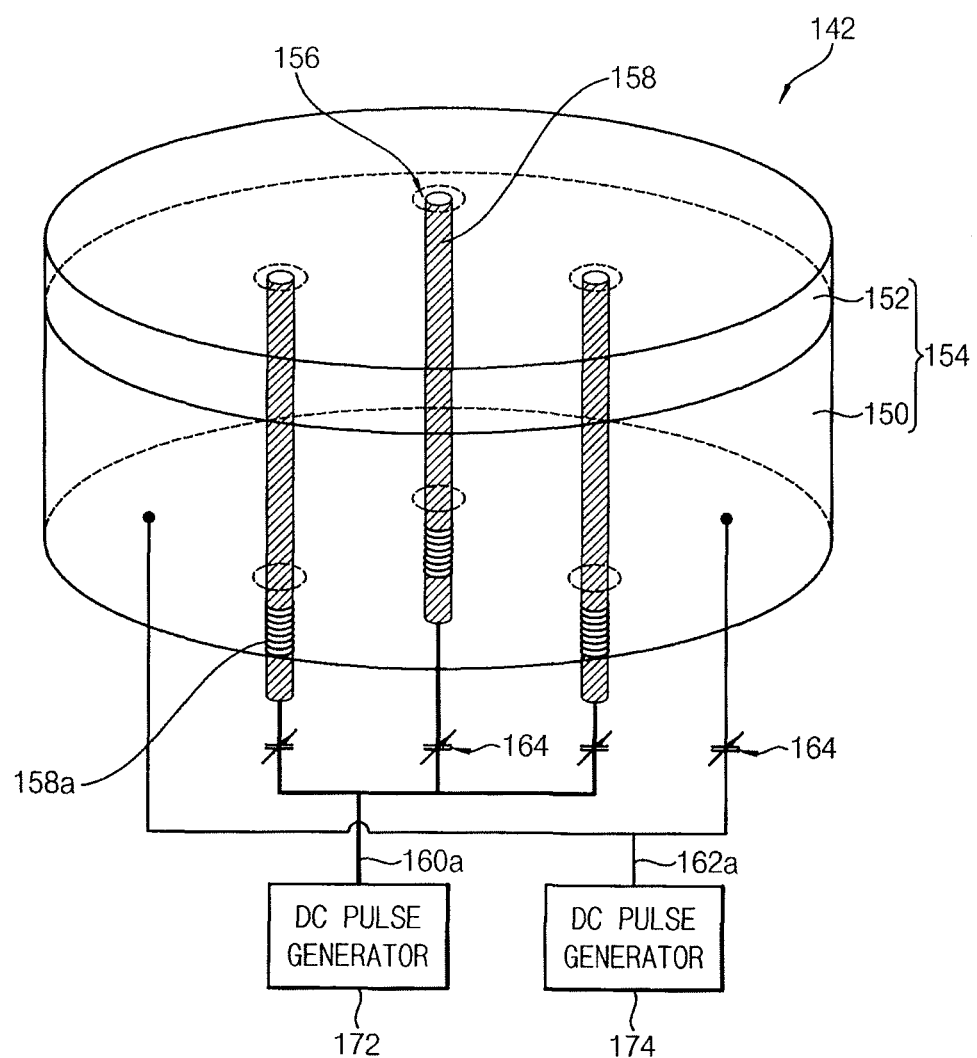
FIG. 8 illustrates an ion accelerator in the etching apparatus in FIG. 7.

FIG. 7 illustrates a cross-sectional view of another embodiment of an etching apparatus. This embodiment of the etching apparatus may be substantially the same as or similar to that described with reference to FIG. 1, except for the ion accelerator. FIG. 8 illustrates a perspective view illustrating an ion accelerator in the etching apparatus of FIG. 7.

Referring to FIGS. 7 and 8, an etching apparatus may include a chamber 102, a gas supply unit 104, a plasma generator 106, an ion accelerator 142, and a gas exhauster unit (not illustrated).

The ion accelerator 142 may include an electrode plate 150, an insulation coating layer 152, a plurality of electrode rods 158, first and second connection lines 160a and 162a, a first DC pulse generator 172, and a second DC pulse generator 174.

A stacked structure 154 including the electrode plate 150 and the insulation coating layer 152 may have substantially the same structure as that described with reference to FIG. 1. The electrode rods 158 may have substantially the same structure as that described with reference to FIG. 1.

The first DC pulse generator 172 may generate a first DC pulse which is supplied to the electrode rods 158. The first DC pulse generator 172 may control a voltage level of the first DC pulse, a first voltage. For example, the first DC pulse generator 172 may generate a DC voltage pulse that is a pulsed first voltage of several to hundreds of kV levels with a predetermined cycle.

The first connection line 160a may electrically connect the first DC pulse generator 172 with the electrode rods 158. The first DC pulse generated by the first DC pulse generator 172 may be supplied directly to a first portion of the bottom surface of the substrate W via the first connection line 160a and the electrode rods 158. When the first DC pulse is supplied during a cycle, the electric potential of the first portion of the substrate W directly connected to each electrode rod 158 may be increased greatly.

The second pulse generator 174 may generate a second DC pulse which is supplied to the electrode plate 152. The second DC pulse generator 174 may generate a DC voltage pulse that is a pulsed second voltage, with a predetermined cycle. The second DC pulse generator 174 may control a voltage level of the second DC pulse.

The second connection line 162a may electrically connect the second DC pulse generator 174 with the electrode plate 150. The second DC pulse generated by the second DC pulse generator 174 may be supplied to the electrode plate 150. When the second DC pulse is supplied during a cycle, the electric potential of a second portion of the substrate W facing the electrode plate 150 may be increased by a capacitive-coupling effect of the electrode plate 150.

The ion accelerator 142 may have two or more DC pulse generators. The DC voltage pulses supplied to the first portion of the substrate W and the electrode plate 150 may be generated by different DC pulse generators, respectively. Each DC pulse generator may generate a desired voltage pulse. As illustrated in FIG. 7, a voltage control member may not be provided in any of the first and the second connection lines 160a and 162a. However, as illustrated in FIG. 8, one or more voltage control members 164 may be provided in either or both of the first and second connection lines 160a and 162a. The voltage control members 164 may include a variable capacitor or a variable resistor. The entire upper surface of the substrate W may be etched uniformly, and the etching rate of the layer on the substrate W or the substrate W itself may be increased.

Plasma Etching Method

Figure 9:
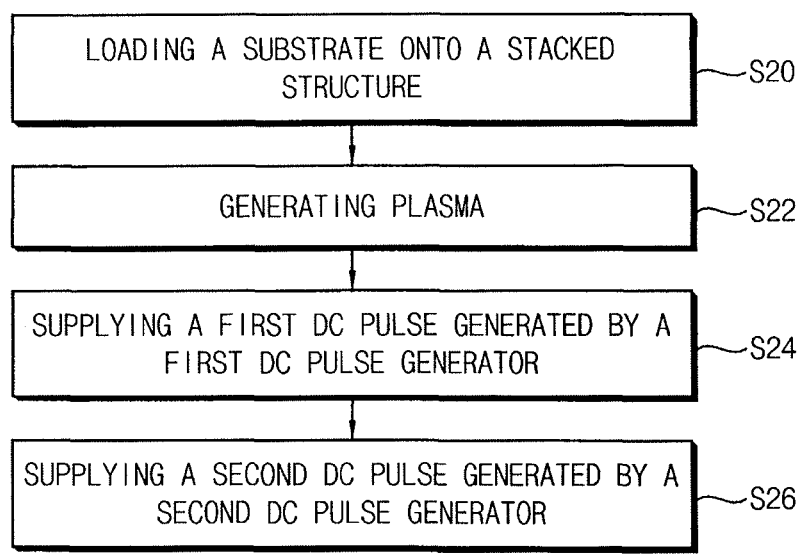
FIG. 9 illustrates another embodiment of an etching process.

FIG. 9 illustrates another embodiment of an etching method. This method may be implemented using the etching apparatus in FIG. 7 or 8 or using a different etching apparatus. Referring to FIG. 9, a substrate W may be loaded on a stacked structure 154 in a chamber 102 (S20). The stacked structure 154 may include an electrode plate 150 and an insulation coating layer 152.

An etching gas may be introduced into the chamber 102, and plasma may be generated from the etching gas (S22).

A first DC pulse generated by a first DC pulse generator 172 may be supplied to first portions of the bottom surface of the substrate W (S24). Electrode rods 158 may directly contact the first portion of the bottom surface of the substrate W. The first DC pulse may be supplied to the substrate W via the electrode rods 158. When the first DC pulse is supplied, an electric potential of the first portion may be increased. The electric potential of the first portion may be referred to as a first electric potential.

A second DC pulse generated by a second DC pulse generator 174 may be supplied to the electrode plate 150 (S26). When the first and second pulses are supplied, an electric potential of a second portion of the substrate W may increase by the first and second DC pulses. The electric potential of the second portion may be referred to as a second electric potential.

The voltages of the first and second DC pulses may be substantially the same as or different from each other. For example, an absolute value of the voltage of the second DC pulse may be substantially the same as or greater than that of the first DC pulse. As a result, the first and second electric potentials may be substantially the same as each other.

When the first and second DC pulses are supplied during a cycle, reactive ions may be accelerated in directions toward the first and second portions to etch a layer on the substrate W or the substrate W itself. According to the above-mentioned etching method, the entire upper surface of the substrate W may be etched uniformly, and the etching rate of the layer on the substrate W or the substrate W itself may be increased.

Plasma Etching Apparatus

Figure 10:
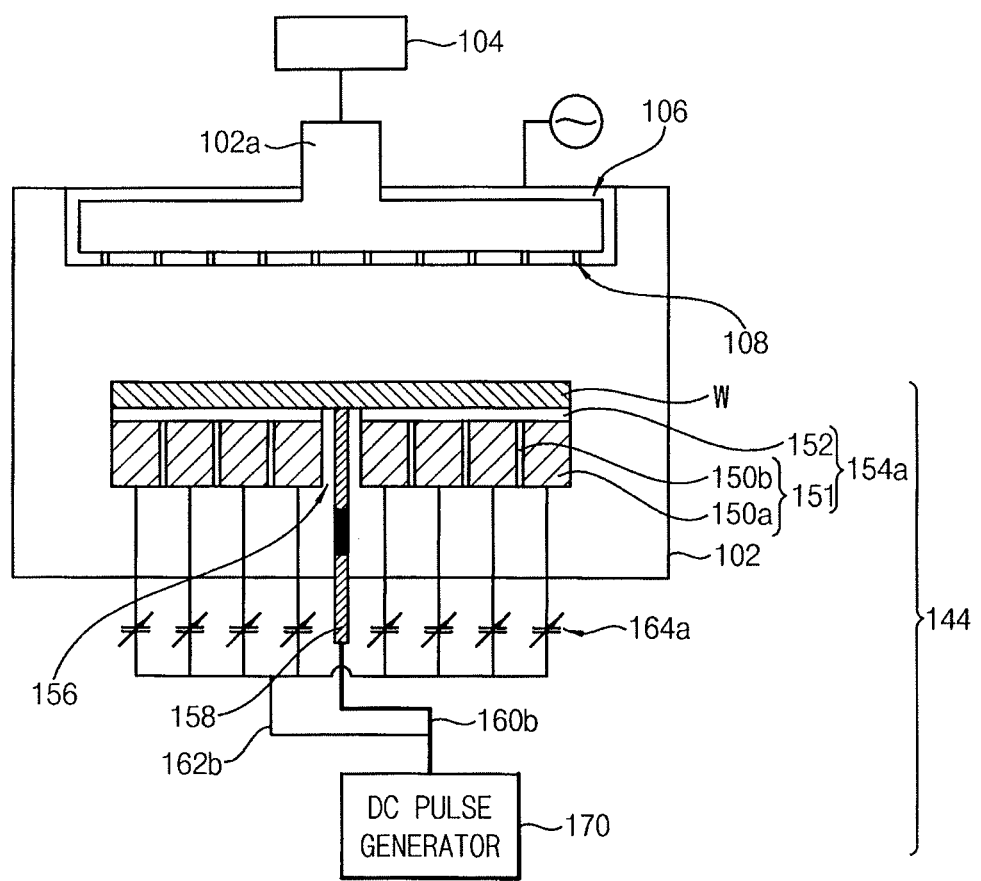
FIG. 10 illustrates another embodiment of an etching apparatus.
Figure 11:
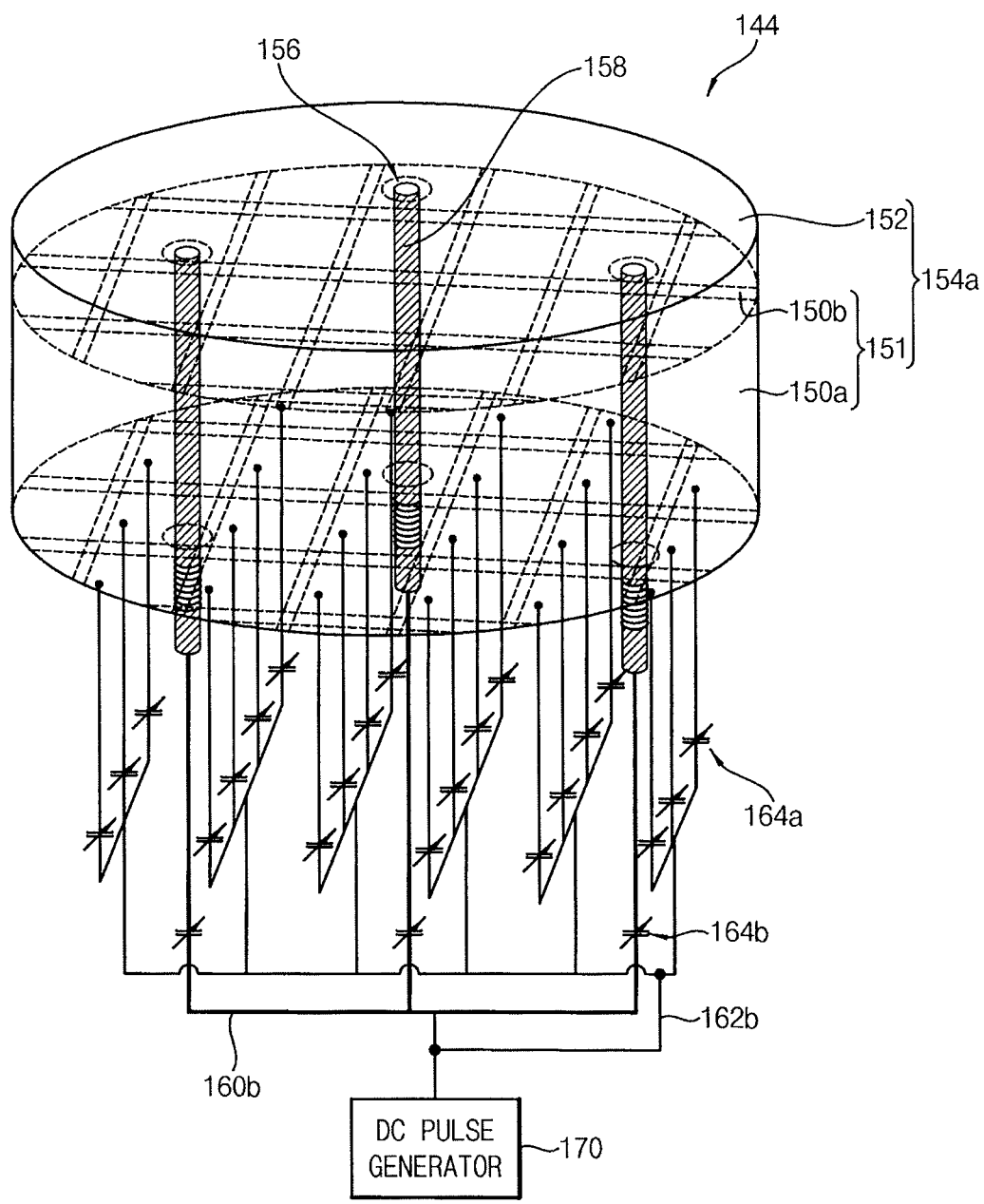
FIG. 11 illustrates an ion accelerator in the etching apparatus in FIG. 10.
Figure 12:
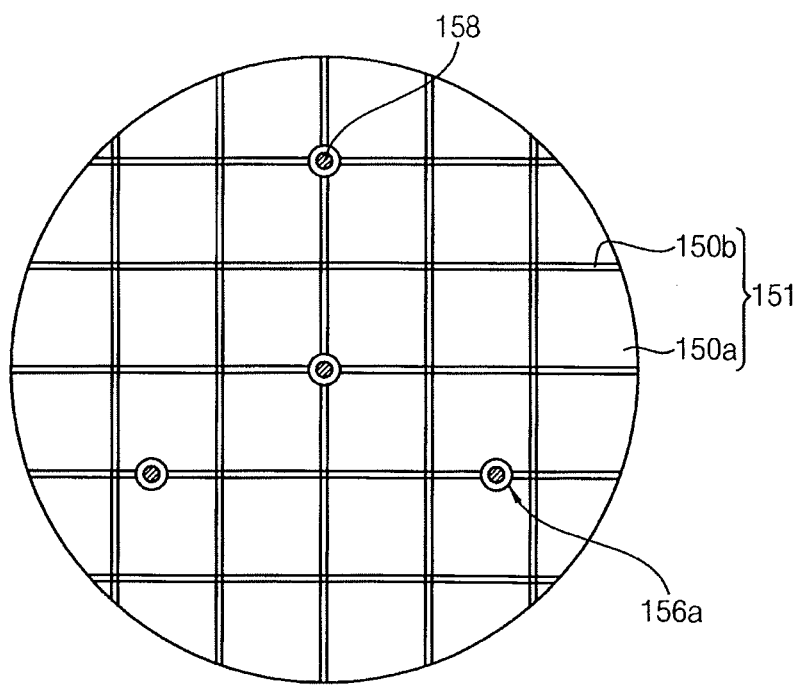
FIG. 12 illustrates an electrode plate pattern in the ion accelerator in FIG. 11.

FIG. 10 illustrates a cross-sectional view of another embodiment of an etching apparatus. FIG. 11 illustrates a perspective view illustrating an ion accelerator in the etching apparatus of FIG. 10. FIG. 12 illustrates a plan view illustrating an electrode plate pattern of the ion accelerator of FIG. 11.

Referring to FIGS. 10 to 12, an etching apparatus may include a chamber 102, a gas supply unit 104, a plasma generator 106, an ion accelerator 144, and a gas exhauster unit. The ion accelerator 144 may include an electrode plate structure 151, an insulation coating layer 152, a plurality of electrode rods 158, first and second connection lines 160b and 162b, a first voltage control member 164a, and a DC pulse generator 170.

The electrode plate structure 151 may have, for example, a cylindrical shape. The electrode plate structure 151 may be divided into conductive portions and insulating portions. The electrode plate structure 151 may have a plurality of electrode plate patterns 150a and insulating pattern 150b arranged between the electrode plate patterns 150a.

In this embodiment, the electrode plate pattern 150a may have a rectangular shape. Most of the electrode plate patterns 150a not located at the edge portions of the electrode plate structure 151 may have a rectangular pillar shape. The insulating pattern 150b may have a shape such that at least a portion of a gap between the electrode plate patterns 150a is filled up with an insulating material.

The electrode plate structure 151 may have a grid shape. The electrode plate structure 151 may include conductive portions of the electrode plate patterns 150a and insulating portions of the insulating patterns 150b. The conductive portion may have an isolated shape by the insulating portion.

The conductive portions may be a main region to which the DC pulse is supplied and the insulating portion may be a peripheral region which insulates the conductive portions from each other. The area of the upper surface of the insulating portion may be less than that of the conductive portion. The rectangular shape and size of the upper surface of the electrode plate structure 150a may be changed in various ways.

The insulation coating layer 152 may be provided on the entire upper surface of the electrode plate structure 151. The insulation coating layer 152 may include a ceramic material.

The substrate W may be loaded on a stacked structure 154a having the electrode plate structure 151 and the insulation coating layer 152. The size of the upper surface of the stacked structure 154a may be greater than that of substrate W. The entire bottom surface of the substrate W may contact the stacked structure 154a.

The stacked structure 154a may include through holes 156 through which the electrode rods 158 are inserted. The through holes 156 may penetrate through the stacked structure 154a from the upper surface to a lower surface thereof The electrode rods 158 may be inserted into the through holes 156. The electrode rods 158 may be substantially the same as those described with reference to FIG. 1.

The first DC pulse generator 170 may generate a DC voltage pulse which is supplied to the electrode rods 158 and the electrode plate patterns 150a. The DC pulse generator 170 may generate a DC voltage pulse that is a negative pulsed voltage of several to hundreds of kV levels with a predetermined cycle.

The first connection line 160b may electrically connect the DC pulse generator 170 with the electrode rods 158. The DC voltage pulse generated by the DC pulse generator 170 may be supplied directly to a first portion of the bottom surface of the substrate W via the first connection line 160b and the electrode rods 158. When the DC voltage pulse is supplied during a cycle, the electric potential of the first portion of the substrate W directly connected to each electrode rod 158 may be increased greatly.

The second connection line 162b may be branched off from the first connection line 160b to be connected to the electrode plate patterns 150a. That is, the electrode plate patterns 150a may be electrically connected in parallel to a circuit connecting the DC pulse generator 170 and the electrode rods 158, so that the DC voltage pulse is supplied to the electrode plate patterns 150a.

The first voltage control member 164a may be provided in any one of the second connection lines 162b. The second voltage control member 164b may be provided in the first connection line 160b selectively. The first and the second voltage control members 164a and 164b may include a variable capacitor or a variable resistor.

The first voltage control member 164a may control the voltage level of the DC voltage pulse which is supplied to the respective electrode plate patterns 150a. The electric potential of each portion of the substrate W facing the electrode plate patterns 150a may be controlled.

The second voltage control member 164b may control the voltage level of the DC voltage pulse which is supplied to the respective electrode rods 158. The electric potential of each portion of the substrate W contacting the electrode rods 158 may be controlled.

The electric potentials of the portions of the substrate W may be substantially the same as or different from each other. The etching rate of each portion of the substrate W may be controlled, respectively. For example, a DC voltage pulse having a greater absolute value may be supplied to increase the etching rate at a predetermined portion. Alternatively, the DC voltage pulse having a lower absolute value may be supplied to decrease the etching rate at a predetermined portion. Also, the voltage of the DC voltage pulse may be controlled such that the gradient of the etching rate may not occur at each portion of the substrate W.

Plasma Etching Apparatus

Figure 13:
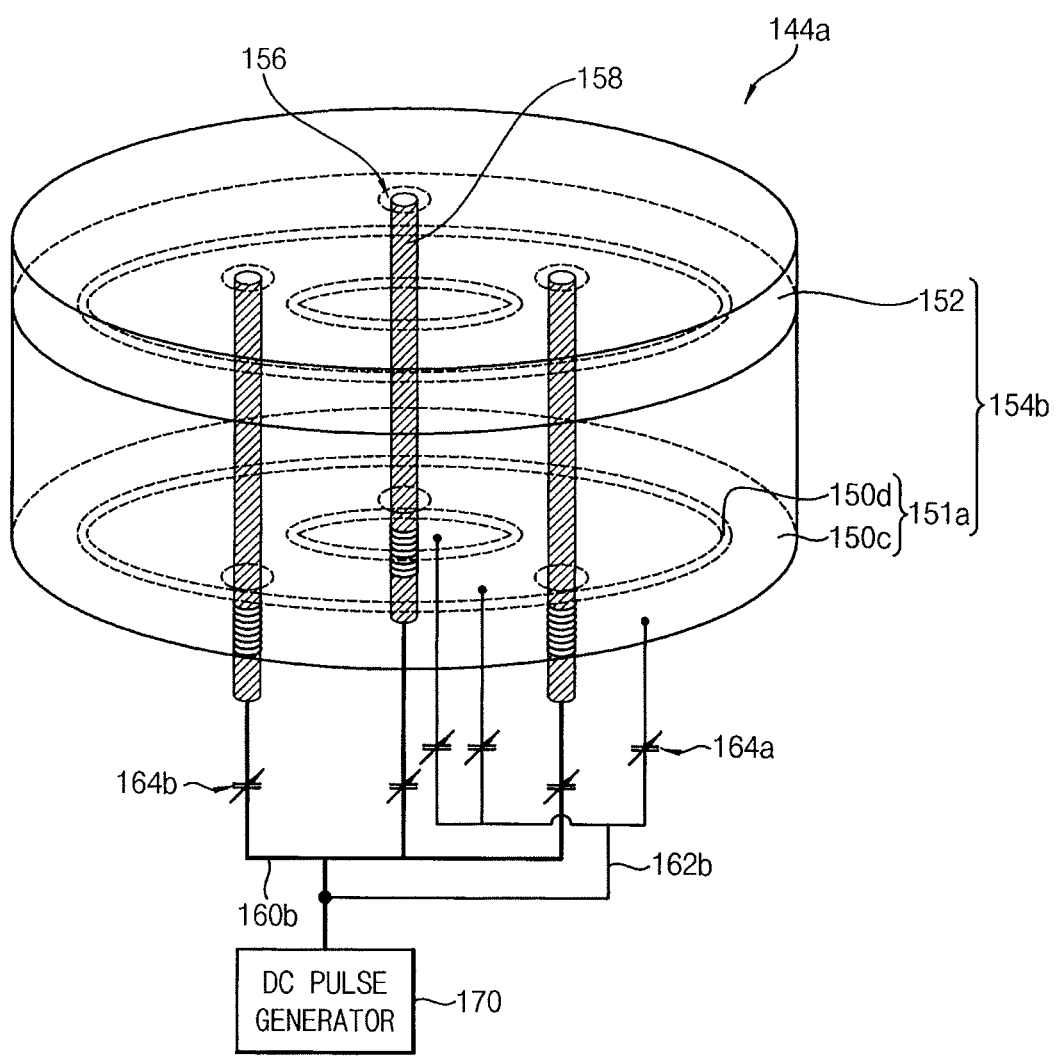
FIG. 13 illustrates another example of an ion accelerator in an etching apparatus.
Figure 14:
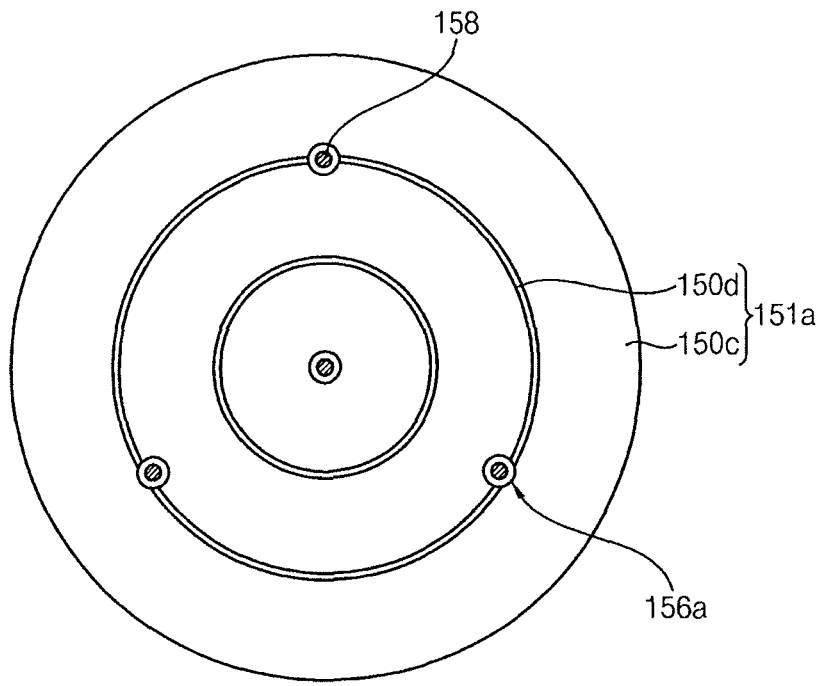
FIG. 14 illustrates an electrode plate pattern in the ion accelerator in FIG. 13.

FIG. 13 illustrates a perspective view illustrating another embodiment of an ion accelerator in the etching apparatus. FIG. 14 illustrates a plan view illustrating an electrode plate pattern of the ion accelerator of FIG. 13. The etching apparatus may be substantially the same as or similar to that described with reference to FIGS. 10 and 11, except for the ion accelerator.

Referring to FIGS. 13 and 14, an ion accelerator 144a may include an electrode plate structure 151a, an insulation coating layer 152, a plurality of electrode rods 158, first and second connection lines 160b and 162b, a first voltage control member 164a, and a DC pulse generator 170.

The electrode plate structure 151 a may have a cylindrical shape. The electrode plate structure 151 a may be divided into conductive portions and insulating portions. The electrode plate structure 151a may have a plurality of electrode plate patterns 150c and insulating pattern 150d arranged between the electrode plate patterns 150c. The portions of the electrode plate patterns 150c may have the conductive portions and the portions of the insulating patterns 150d may have the insulating portions.

The electrode plate pattern 150c may have a concentric shape. The insulating pattern 150d may have a shape such that at least a portion of a gap between the electrode plate patterns 150c is filled with an insulating material. The area of the upper surface of the insulating portion may be less than that of the conductive portion. The shape and size of the upper surface of the electrode plate structure 150c may be changed in various ways.

The insulation coating layer 152 may be provided on the entire upper surface of the electrode plate structure 151. The substrate W may be loaded on a stacked structure 154b having the electrode plate structure 151 a and the insulation coating layer 152.

The electrode rods 158 may have substantially the same as those illustrated in FIG. 1. The DC pulse generator 170 may generate a DC voltage pulse to be supplied to the electrode rods 158 and the electrode plate patterns 150c.

The first and the second connection lines 160b and 162b and the first voltage control member 164a may be substantially the same as those described with reference to FIG. 11. The second voltage control member 164b may be inserted into the first connection line 160b, selectively. The second voltage control member 164b may be substantially the same as that described with reference to FIG. 11.

In this embodiment, the electric potential of each portion having a concentric shape may be controlled independently. That is, the electric potentials of central portion and edge portion may be controlled independently to be the same as or different values. The etching rate of each portion of the substrate may be controlled respectively.

Plasma Etching Method

Figure 15:
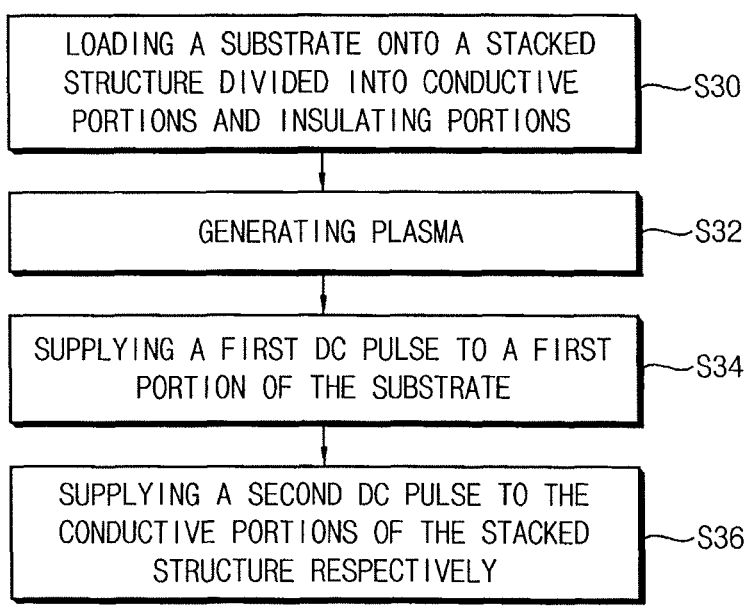
FIG. 15 illustrates another embodiment of an etching process.

FIG. 15 illustrates another embodiment of an etching method. This embodiment may be performed using the etching apparatus illustrated in FIG. 11 or 13 or a different apparatus.

Referring to FIG. 15, a substrate W may be loaded on a stacked structure 154*a* in a chamber 102 (S30). The stacked structure 154*a* may include an electrode plate structure 151 and an insulation coating layer 152. The electrode plate structure 151 may be divided into conductive portions and insulating portions. An electrode plate pattern 150*a* may be provided at the conductive portions and an insulating pattern 150*b* may be provided at the insulating portions.

An etching gas may be introduced into the chamber 102, and plasma may be generated from the etching gas (S32).

Electrode rods 158 may be directly electrically connected to first portions of a bottom surface of the substrate W. A first DC pulse may be supplied to the first portions of the substrate W via the electrode rods 158 (S34). When the first DC pulse is supplied, an electric potential of the first portions may be increased. The first DC pulse may be generated by a DC pulse generator.

The voltage levels of the first DC pulses which are supplied to electrode rods 158 may be substantially the same as or different from each other. The first DC pulse may be supplied to the respective first portion independently. The voltage level of the first DC pulse may be controlled by the second voltage control member 164*b* inserted into the first connection line 160*b*.

A second DC pulse may be supplied to the conductive portions of the electrode plate structure 151, independently (S36). That is, the second DC pulse may be supplied to the electrode plate patterns 150*a*. The voltage levels of the second DC pulses supplied to electrode plate patterns 150*a* may be substantially the same as or different from each other. The electric potential of second portions of the substrate W may be controlled independently. The voltage level of the second DC pulse may be controlled by the first voltage control member 164*a* inserted into the second connection line 162*b*. The etching rate at each portion of the substrate W may be controlled.

In this embodiment, the first DC pulse and the second DC pulse may be generated by the identical DC pulse generator.

As described above, when the first and the second DC pulse are supplied, the electric potential of the substrate W may be increased. As the voltage level at each portion of the substrate W are controlled, electric potentials of the portions of the substrate W may be substantially the same as or different from each other.

When the first and the second DC pulses are supplied, reactive ions may be accelerated in directions toward the first and the second portions of the substrate W to etch a layer on the substrate W or the substrate W itself.

According to the above-mentioned etching method, the electric potential of each portion of the substrate W may be controlled independently and the etching rate of each portion of the substrate W may be controlled.

Plasma Etching Apparatus

Figure 16:
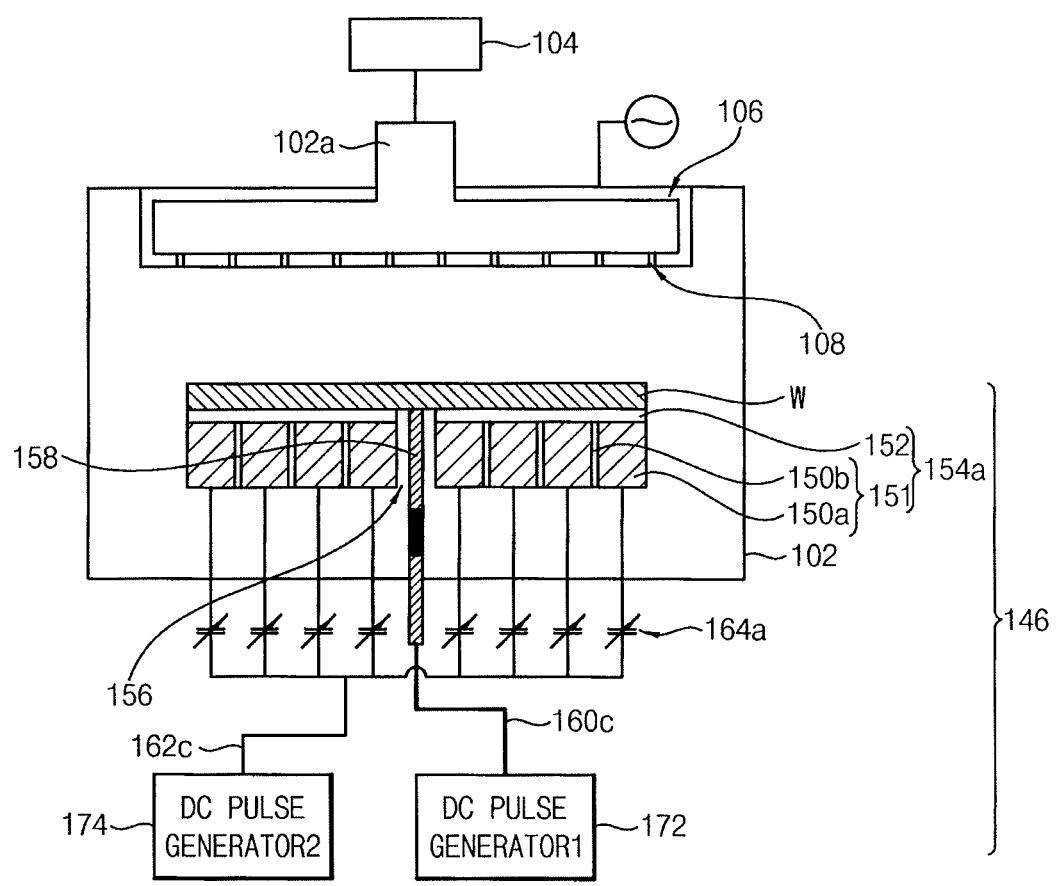
FIG. 16 illustrates another embodiment of an etching apparatus.
Figure 17:
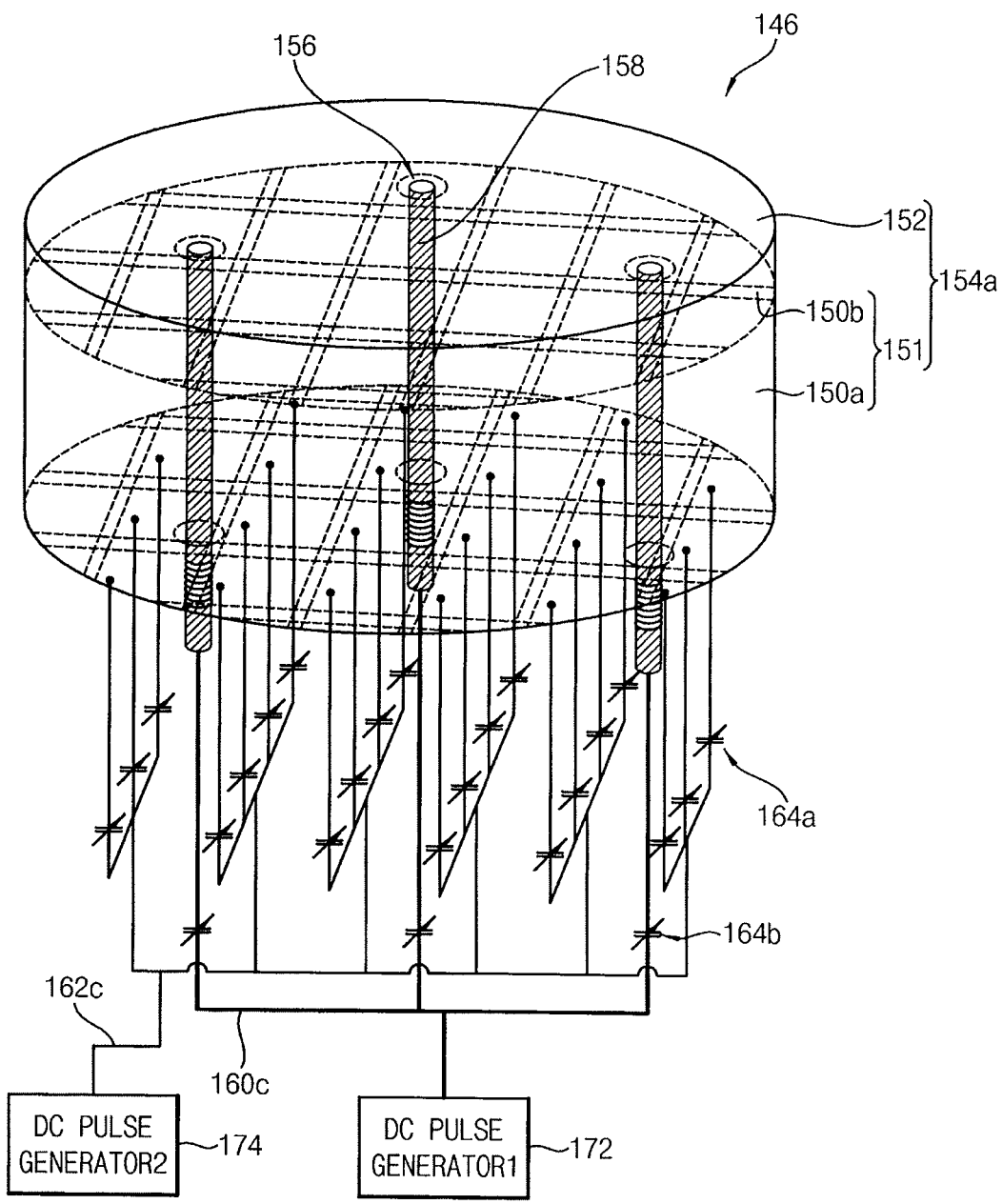
FIG. 17 illustrates an ion accelerator of the etching apparatus in FIG. 16.

FIG. 16 illustrates a cross-sectional view of another etching apparatus. FIG. 17 illustrates a perspective view illustrating an ion accelerator in the etching apparatus of FIG. 16. The etching apparatus may be substantially the same as or similar to that described with reference to FIG. 10, except for the ion accelerator and the DC pulse generators.

Referring to FIGS. 16 and 17, an etching apparatus may include a chamber 102, a gas supply unit 104, a plasma generator 106, an ion accelerator 146, and a gas exhauster unit. The ion accelerator 146 may include an electrode plate structure 151, an insulation coating layer 152, a plurality of electrode rods 158, first and second connection lines 160*c* and 162*c*, a first voltage control member 164*a*, a first DC pulse generator 172, and a second DC pulse generator 174.

A stacked structure 154*a* having the electrode plate structure 151 and the insulation coating layer 152 may have substantially the same structure, as that described with reference to FIG. 11. That is, the electrode plate structure 151 may include an electrode plate pattern 150*a* and an insulating pattern 150*b*. The electrode plate pattern 150*a* may have a rectangular shape.

The electrode rods 158 may be substantially the same as those described with reference to FIG. 11. The first DC pulse generator 172 may generate a first DC pulse which is supplied to the electrode rods 158.

The first connection line 160*c* may electrically connect the first DC pulse generator 172 with the electrode rods 158. The first DC pulse generated by the first DC pulse generator 172 may be supplied directly to a first portion of the bottom surface of the substrate W via the first connection line 160*c* and the electrode rods 158.

The second DC pulse generator 174 may generate a second DC pulse which is supplied to the electrode plate patterns 150*a*. The second DC pulse generator 174 may generate the second DC pulse with a predetermined cycle.

The second connection line 162*c* may electrically connect the second DC pulse generator 174 with the electrode plate patterns 150*a*. The second DC pulse generated by the second DC pulse generator 174 may be supplied to the electrode plate patterns 150*a*.

The first voltage control member 164*a* may be provided in any one of the second connection lines 162*c*. The first voltage control member 164*a* may control the voltage level of the first DC pulse supplied to the respective electrode plate patterns 150*a*, independently.

The second voltage control member 164*b* may be provided in the first connection line 160*c* selectively. The second voltage control member 164*b* may be provided in any one of the first connection lines 160*c*. The first and the second voltage control members 164*a* and 164*b* may include a variable capacitor or a variable resistor.

The ion accelerator of this embodiment may have two or more DC pulse generators. The DC voltage pulses supplied to the first portion of the substrate W and the electrode plate pattern may be generated by different DC pulse generators, respectively. According to the above-mentioned etching apparatus, the etching rate of each portion of the substrate W may be controlled.

Plasma Etching Apparatus

Figure 18:
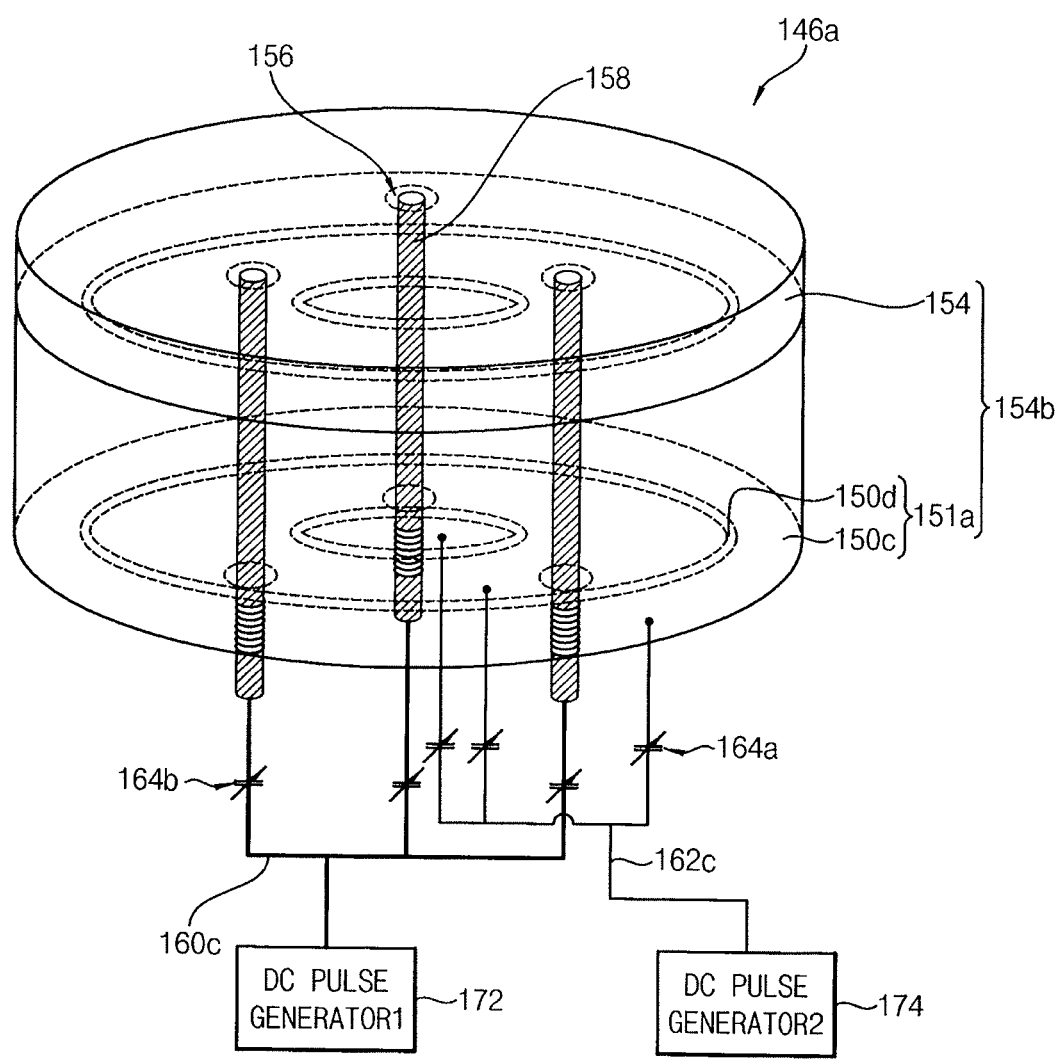
FIG. 18 illustrates an example of another ion accelerator in an etching apparatus.

FIG. 18 illustrates a cross-sectional view illustrating another embodiments of an etching apparatus. The etching apparatus may be substantially the same as or similar to that described with reference to FIGS. 16 and 17, except for the ion accelerator. In this embodiment, the ion accelerator may be substantially the same as or similar to that described with reference to FIG. 13, except for two DC pulse generators.

Referring to FIG. 18, the ion accelerator 146a may include an electrode plate structure 151a, an insulation coating layer 152, a plurality of electrode rods 158, first and second connection lines 160c and 162c, a first voltage control member 164a, a first DC pulse generator 172, and a second DC pulse generator 174.

A stacked structure 154a having the electrode plate structure 151a and the insulation coating layer 152 may have substantially the same structure as that described with reference to FIG. 13. That is, the electrode plate structure 151a may include an electrode plate pattern 150c and an insulating pattern 150d. The electrode plate pattern 150c may have a concentric shape. The electrode rods 158 may be substantially the same as those described with reference to FIG. 13.

The first DC pulse generator 172, the first connection line 160c, the second DC pulse generator 174, the second connection line 162c, and the first voltage control member 164a may be substantially the same as those described with reference to FIG. 17. Selectively, the second voltage control member 164b may be provided at the first connection line. The second voltage control member 164b may be substantially the same as that described with reference to FIG. 17.

The first DC pulse generator 172 may be electrically connected to the electrode rods 158 via the first connection line 160c. The second DC pulse generator 174 may be electrically connected to the electrode plate patterns 150c via the second connection line 162c. The first voltage control member 164a may be provided at the second connection line 162c. The ion accelerator 146a in this embodiment may include two or more DC pulse generators.

According to the above-mentioned etching apparatus, the electric potential of each portion of the substrate may be controlled. The etching rate of each portion of the substrate may be controlled. The etching rates of a central portion and an edge portion may be controlled.

Plasma Etching Method

Figure 19:
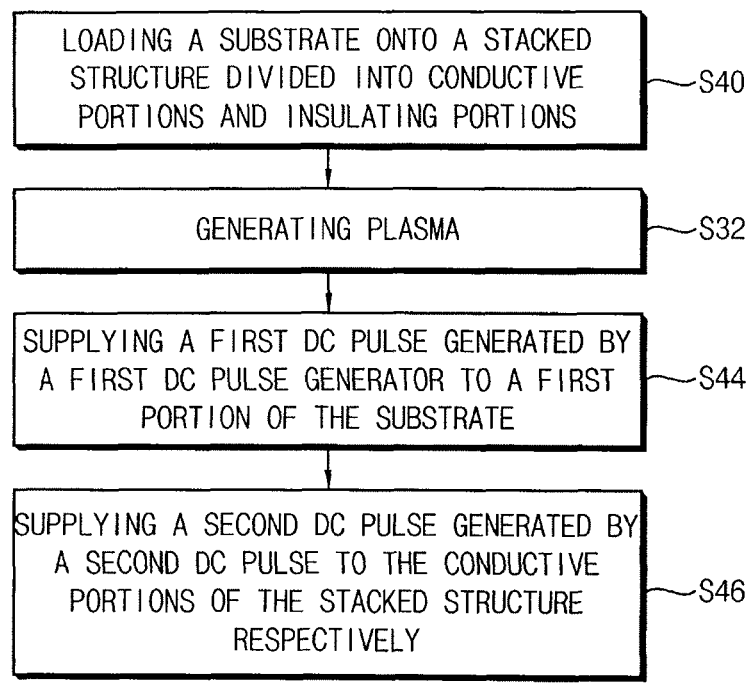
FIG. 19 illustrates another embodiment of an etching process.

FIG. 19 illustrates another embodiment of an etching method. This method may be performed using the etching apparatus illustrated in FIG. 17 or 18 or a different apparatus. Referring to FIG. 19, a substrate W may be loaded on a stacked structure 154a in a chamber 102 (S40).

An etching gas may be introduced into the chamber 102, and plasma may be generated from the etching gas (S42).

A first DC pulse generated by the first DC pulse generator 172 may be supplied to the first portions of the substrate W via the electrode rods 158 (S44). When the first DC pulse is supplied, an electric potential of the first portions may be increased.

One voltage level of the first DC pulse which is supplied to the first portion may be substantially the same as or different from another. The voltage level of the first DC pulse may be controlled by the second voltage control member 164b inserted into the first connection line 160c.

A second DC pulse may be supplied to the conductive portions of the electrode plate structure 151, independently (S46). That is, voltage levels of the second DC pulses which are supplied to conductive portions may be substantially the same as or different from each other. The voltage level of the second DC pulse may be controlled by the first voltage control member 164a inserted into the second connection line 162c. The etching rate at each portion of the substrate W may be controlled.

In this embodiment, the first DC pulse and the second DC pulse may be generated by different DC pulse generators. When the first and the second DC pulse are supplied, the electric potential of the substrate W may increase. As the voltage level at each portion of the substrate W is controlled, electric potentials of the portions of the substrate W may be substantially the same as or different from each other.

When the first and the second DC pulses are supplied, reactive ions may be accelerated in directions toward the first and the second portions of the substrate W to etch a layer on the substrate W or the substrate W itself.

According to the above-mentioned etching method, the electric potential of each portion of the substrate W may be controlled independently, and the etching rate of each portion of the substrate W may be controlled.

By way of summation and review, an electric potential at a portion of the substrate directly contacting the electrode rods is greater than the electric potential at a portion thereof not directly contacting the electrode rods. As a result, an etching rate of the portion of the substrate directly contacting the electrode rods is greater than that of the substrate not directly contacting the electrode rods. This causes uneven etching rates across the entire portions of the substrate.

In contrast, in accordance with embodiments, an etching apparatus and an etching method are provided to increase the electric potential at the portion of the substrate not directly contacting the electrode rods and to control the etching rate over the entire region of the substrate. The substrate is loaded onto a stacked structure having an electrode plate and an insulating coating layer on the electrode plate, in a plasma chamber. A first DC pulse is supplied to first portions of the substrate contacting directly electrode rods. A second DC pulse is supplied to the electrode plate to control an electric potential of a second portion of the substrate facing the electrode plate. The substrate, or a layer formed on the substrate, is etched by reactive ions which are accelerated by the first and the second DC pulse. The electric potential at the portion of the substrate not directly contacting the electrode rods may be increased by capacitive coupling from the electrode plate to improve uniformity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching apparatus, comprising:
   a chamber;
   a plasma generator in the chamber;
   a stacked structure in the chamber to support a substrate thereon, the stacked structure including an electrode plate and an insulation coating layer on the electrode plate;
   electrode rods inserted into holes of the stacked structure to directly contacting the substrate, the electrode rods being spaced apart from sidewalls of the respective ones of the holes;
   at least one DC pulse generator to provide a DC pulse to the electrode plate and the electrode rods;
   first connection lines connecting the DC pulse generator to the electrode rods; and at least one second connection line connecting the DC pulse generator to a lower portion of the electrode plate.

2. The etching apparatus as claimed in claim 1, wherein the first connection lines electrically connect the electrode rods to each other, and electrically connect the DC pulse generator to the electrode rods.

3. The etching apparatus as claimed in claim 1, wherein:
the apparatus includes a single DC pulse generator,
the at least one second connection line branches off from one or more of the first connection lines, and
the single DC pulse generator is electrically connected in parallel to the first connection lines.

4. The etching apparatus as claimed in claim 1, wherein:
the apparatus includes at least two DC pulse generators, and
the first and the second connection lines are respectively connected to the at least two DC pulse generators.

5. The etching apparatus as claimed in claim 1, further comprising:
a voltage control circuit is electrically connected to at least one of the first connection lines or the at least one second connection line.

6. The etching apparatus as claimed in claim 5, wherein the voltage control circuit includes a variable resistor or a variable capacitor.

7. The etching apparatus as claimed in claim 1, wherein:
the electrode plate comprises insulating patterns arranged between electrode plate patterns, and
the electrode plate is divided into conductive portions and insulating portions by the electrode plate patterns and the insulating patterns.

8. The etching apparatus as claimed in claim 7, wherein:
the electrode plate has a substantially cylindrical or circular shape, and
an upper surface of the electrode plate has a grid pattern.

9. The etching apparatus as claimed in claim 7, wherein the electrode plate has a substantially cylindrical or circular shape, and an upper surface of the electrode plate is divided into concentric areas.

10. An apparatus, comprising:
a base to support a substrate;
a plurality of electrode rods extending through holes in the base; and
at least one voltage control circuit coupled to one or more of the plurality of electrode rods, wherein the electrode rods accelerate reactive ions of plasma toward the substrate in response to a first voltage signal and wherein the at least one voltage control circuit adjusts a voltage level of the first voltage signal to control an electric potential of the base.

11. The apparatus as claimed in claim 10, wherein the electric potential of the base controls an etching rate of the substrate.

12. The apparatus as claimed in claim 10, wherein:
a first area of the base includes the one or more electric rods, and
a second area of the substrate does not include electric rods and receives a second voltage signal, wherein an electric potential of the first area of the base is controlled by the first voltage signal and an electric potential of the second area is controlled by the second voltage signal.

13. The apparatus as claimed in claim 12, wherein the first voltage signal and the second voltage signal independently control the electric potentials of the first and second areas of the base.

14. The apparatus as claimed in claim 12, further comprising:
a first voltage control circuit is coupled to the one or more electric rods, and
a second voltage control circuit is coupled to the second area of the base,
wherein the first voltage control circuit adjusts the first voltage signal to a fist level and the second voltage control circuit controls adjusts the second voltage signal to a second level different from the first level.

* * * * *